United States Patent
Park et al.

(10) Patent No.: US 12,181,509 B2
(45) Date of Patent: Dec. 31, 2024

(54) INSULATION RESISTANCE DETECTING APPARATUS, SYSTEM HAVING THE SAME, AND METHOD THEREOF

(71) Applicants: HYUNDAI MOTOR COMPANY, Seoul (KR); KIA CORPORATION, Seoul (KR)

(72) Inventors: Hyo Jin Park, Hwaseong-si (KR); Soon Gil Kweon, Hwaseong-si (KR); Min Taek Kim, Seoul (KR)

(73) Assignees: HYUNDAI MOTOR COMPANY, Seoul (KR); KIA CORPORATION, Seoul (KR)

( * ) Notice: Subject to any disclaimer, the term of this patent is extended or adjusted under 35 U.S.C. 154(b) by 213 days.

(21) Appl. No.: 17/483,012

(22) Filed: Sep. 23, 2021

(65) Prior Publication Data

US 2022/0221500 A1 Jul. 14, 2022

(30) Foreign Application Priority Data

Jan. 11, 2021 (KR) .................. 10-2021-0003165

(51) Int. Cl.
  *G01R 31/12* (2020.01)
  *B60W 50/02* (2012.01)
  *H01M 8/04664* (2016.01)
  *H01M 10/48* (2006.01)
  *H01M 16/00* (2006.01)

(52) U.S. Cl.
  CPC ..... *G01R 31/1227* (2013.01); *B60W 50/0205* (2013.01); *H01M 8/04671* (2013.01); *H01M 10/48* (2013.01); *H01M 16/006* (2013.01); *B60W 2510/242* (2013.01); *H01M 2220/20* (2013.01); *H01M 2250/20* (2013.01)

(58) Field of Classification Search
  CPC ........ B60W 50/0205; B60W 2510/242; G01R 31/1227; H01M 10/48; H01M 16/006; H01M 8/04671; H01M 2220/20; H01M 2250/20
  USPC ................................ 324/500, 551, 425–434
  See application file for complete search history.

(56) References Cited

U.S. PATENT DOCUMENTS

| 10,247,768 B2 | 4/2019 | Lee et al. |
| 2012/0105065 A1* | 5/2012 | Namou ............. G01R 31/3278 324/415 |

(Continued)

FOREIGN PATENT DOCUMENTS

| KR | 2008-0000657 A | 1/2008 |
| KR | 10-1836651 B1 | 3/2018 |
| KR | 2020-0027225 A | 3/2020 |

*Primary Examiner* — Alexander Satanovsky
*Assistant Examiner* — Trung Q Nguyen
(74) *Attorney, Agent, or Firm* — MCDONNELL BOEHNEN HULBERT & BERGHOFF LLP

(57) ABSTRACT

An insulation resistance detection apparatus includes a processor configured to separate a fuel cell from a high voltage battery depending on an insulation resistance value of a vehicle during driving of the vehicle, and then to measure an insulation resistance value of the fuel cell to determine whether it is a failure of the fuel cell or a failure of the high voltage battery, and when it is the failure of the fuel cell, to determine a cause of the failure by calculating an insulation resistance variation; and a storage configured to store data and algorithms driven by the processor.

17 Claims, 6 Drawing Sheets

(56) References Cited

U.S. PATENT DOCUMENTS

| | | | |
|---|---|---|---|
| 2015/0343903 A1* | 12/2015 | Lee | B60L 58/40 |
| | | | 701/22 |
| 2016/0133965 A1* | 5/2016 | Imanishi | B60L 58/10 |
| | | | 429/444 |
| 2017/0356951 A1 | 12/2017 | Lee et al. | |
| 2019/0312291 A1* | 10/2019 | Kim | H01M 8/04089 |
| 2020/0075977 A1 | 3/2020 | Kim | |
| 2020/0212507 A1* | 7/2020 | Shimizu | H01M 10/613 |
| 2022/0021045 A1* | 1/2022 | Onuki | H01M 10/625 |

\* cited by examiner

INSULATION RESISTANCE DETECTING APPARATUS, SYSTEM HAVING THE SAME, AND METHOD THEREOF

CROSS REFERENCE TO RELATED APPLICATIONS

This application claims priority to and benefits of Korean Patent Application No. 10-2021-0003165, filed in the Korean Intellectual Property Office on Jan. 11, 2021, the entire contents of which are incorporated herein by reference.

BACKGROUND

(a) Field

The present disclosure relates to an insulation resistance detection apparatus, a system including the same, and a method thereof, and more particularly, to a technique for detecting a decrease in insulation resistance due to a decrease in lifespan of an ion filter by separating it from a system failure.

(b) Description of the Related Art

A fuel cell is a cell that directly converts chemical energy generated by oxidation of fuel into electrical energy, and is a kind of power generation device. Recently, a fuel cell power generation system has been put into practical use, and since a reaction product of a fuel cell is pure water, research for use as an energy source for eco-friendly vehicles is being actively conducted.

In particular, a fuel cell vehicle is formed to include a hybrid system using not only a fuel cell as a primary energy source but also a secondary energy storage device such as a battery or a super capacitor. Herein, a bidirectional converter is provided to serve to maintain a constant fuel utilization rate and to balance power between a fuel cell and the load by charging and discharging appropriate energy through an energy storage device such as a battery.

Insulation resistance should be kept from deteriorating in a vehicle using such a high voltage battery or a high voltage of a fuel cell. In general, a main cause of lowering insulation resistance of the vehicle may be an internal short circuit or insulation breakdown of a high voltage component, insulation breakdown of a high voltage cable, etc., and even when a coolant flowing inside the fuel cell stack is contaminated, electricity flows through ions inside the coolant, so that insulation resistance of a high voltage terminal may be lowered.

Conventionally, insulation resistance was measured in real time, and when an insulation resistance value reached less than a minimum reference value, a driver was notified of a breakdown of insulation resistance.

In the case of such a decrease in insulation resistance, there was a hassle of having to carry out maintenance directly to determine the cause, and in the event of a breakdown due to ionic conductivity, by checking that the insulation resistance of the high voltage component is normal, there was a technical limitation in which the cause of the decrease in insulation resistance could not be determined such as when the high voltage component is not the cause, it is assumed that an ion filter is the cause.

The above information disclosed in this Background section is only for enhancement of understanding of the background of the disclosure, and therefore, it may contain information that does not form the prior art that is already known in this country to a person of ordinary skill in the art.

SUMMARY

An exemplary embodiment of the present disclosure has been made in an effort to provide an insulation resistance detection apparatus, a system including the same, and a method thereof, capable of limiting and diagnosing a position where insulation resistance is lowered by separating a fuel cell stack and high voltage components through control of a main relay and accurately determining a cause of lowering the insulation resistance by using a variation of the lowered insulation resistance during driving of a vehicle.

The technical objects of the present disclosure are not limited to the objects mentioned above, and other technical objects not mentioned can be clearly understood by those skilled in the art from the description of the claims.

An exemplary embodiment of the present disclosure provides an insulation resistance detection apparatus including a processor configured to separate a fuel cell from a high voltage battery depending on an insulation resistance value of a vehicle during driving of the vehicle, and then to measure an insulation resistance value of the fuel cell to determine whether it is a failure of the fuel cell or a failure of the high voltage battery, and when it is the failure of the fuel cell, to determine a cause of the failure by calculating a variation in insulation resistance. The insulation resistance detection apparatus also includes a storage configured to store data and algorithms driven by the processor. In an exemplary embodiment, the processor may calculate an average value of insulation resistance values of the vehicle and stores the average insulation resistance value in the storage during starting off of the vehicle.

In an exemplary embodiment, the processor may maintain an open circuit voltage (OCV) state by blocking a stack current of the fuel cell when the insulation resistance value of the vehicle is smaller than a predetermined reference value.

In an exemplary embodiment, the processor may turn off a main relay connected between the fuel cell and the high voltage battery when the insulation resistance value of the vehicle is smaller than a predetermined reference value.

In an exemplary embodiment, the processor may compare the insulation resistance value of the fuel cell with a predetermined reference value in a state in which the main relay is turned off.

In an exemplary embodiment, the processor may determine that it is a failure due to insulation resistance of the high voltage battery when the insulation resistance value of the fuel cell is equal to or greater than the reference value.

In an exemplary embodiment, the processor, when the insulation resistance value of the fuel cell is smaller than the reference value, may calculate a difference value between the average insulation resistance value and the insulation resistance value of the fuel cell as the insulation resistance variation.

In an exemplary embodiment, the processor may compare the insulation resistance variation and a predetermined variation reference value, to determine that it is a failure of insulation resistance due to an increase in ionic conductivity when the insulation resistance variation is smaller than the variation reference value, and to determine that it is a failure due to insulation breakdown of the fuel cell when the insulation resistance variation is equal to or greater than the variation reference value.

In an exemplary embodiment, the processor may determine that it is a failure due to insulation breakdown of the fuel cell when the insulation resistance value rapidly changes, and may determine that it is a failure in insulation resistance due to an increase in ionic conductivity when the insulation resistance value smoothly changes.

In an exemplary embodiment, the processor may notify replacement of an ion filter when it is determined that it is the failure in insulation resistance due to the increase in ionic conductivity.

An exemplary embodiment of the present disclosure provides a vehicle system including a fuel cell configured to supply power; a high voltage battery configured to charge and discharge, a main delay positioned between the fuel cell and the high voltage battery, a first insulation resistance measurement device connected to an output terminal of the fuel cell to measure an insulation resistance value of the fuel cell, a second insulation resistance measurement device connected to an output terminal of the high voltage battery to measure an insulation resistance value of the high voltage battery, and an insulation resistance detection apparatus configured to separate a fuel cell from a high voltage battery depending on an insulation resistance value of a vehicle during driving of the vehicle, and then to determine whether it is a failure of the fuel cell or a failure of the high voltage battery, and when it is the failure of the fuel cell, to determine a cause of the failure by calculating an insulation resistance variation.

In an exemplary embodiment, the insulation resistance detection apparatus may turn off a main relay connected between the fuel cell and the high voltage battery when the insulation value of the vehicle is smaller than a predetermined reference value, and may control the first insulation resistance measurement device to measure the insulation resistance value of the fuel cell.

In an exemplary embodiment, the insulation resistance detection apparatus may determine that it is a failure due to insulation resistance of the high voltage battery when the insulation resistance value of the fuel cell is equal to or greater than a predetermined reference value, and may calculate the insulation resistance variation when the insulation resistance value of the fuel cell is smaller than the reference value.

In an exemplary embodiment, the insulation resistance detection apparatus may calculate an average value of insulation resistance values of the vehicle and store the average insulation resistance value in the storage when starting off the vehicle, and may calculate a difference value between the average insulation resistance value and the insulation resistance value of the fuel cell as the insulation resistance variation.

An exemplary embodiment of the present disclosure provides an insulation resistance detection method including: separating a fuel cell from a high voltage battery depending on an insulation resistance value of a vehicle during driving of the vehicle; determining whether it is a failure of the fuel cell or a failure of the high voltage battery by measuring the insulation resistance value of the fuel cell; and determining a cause of the failure by calculating an insulation resistance variation when it is the failure of the fuel cell.

In an exemplary embodiment, the method may further include calculating an average value of insulation resistance values of the vehicle and store the average insulation resistance value in the storage when starting off the vehicle.

In an exemplary embodiment, the separating of the fuel cell and the high voltage battery may include: maintaining an open circuit voltage (OCV) state by blocking a stack current of the fuel cell when the insulation resistance value of the vehicle is smaller than a predetermined reference value; and turning off a main relay connected between the fuel cell and the high voltage battery.

In an exemplary embodiment, the determining of whether it is a failure of the fuel cell or a failure of the high voltage battery may include determining whether the insulation resistance value of the fuel cell is smaller than a predetermined reference value in a state where the main relay is turned off, and determining that it is a failure due to insulation resistance of the high voltage battery when the insulation resistance value of the fuel cell is equal to or greater than the reference value.

In an exemplary embodiment, the determining of whether the fault is due to the ionic conductivity may include, when the insulation resistance value of the fuel cell is smaller than the reference value, calculating a difference value between the average insulation resistance value and the insulation resistance value of the fuel cell as the insulation resistance variation.

In an exemplary embodiment, the determining of whether the fault is due to the ionic conductivity may include comparing the insulation resistance variation and a predetermined variation reference value, determining that it is a failure of insulation resistance due to an increase in ionic conductivity when a predetermined insulation resistance variation is smaller than the variation reference value, and determines that it is a failure due to insulation breakdown of the fuel cell when the insulation resistance variation is equal to or greater than the variation reference value.

According to the present technique, it is possible to limit and diagnose a position where insulation resistance is lowered by separating a fuel cell stack and high voltage components through control of a main relay and to accurately determine a cause of lowering the insulation resistance by using a variation of the lowered insulation resistance during driving of a vehicle.

In addition, various effects that can be directly or indirectly identified through this document may be provided.

DETAILED DESCRIPTION

Figure 1:
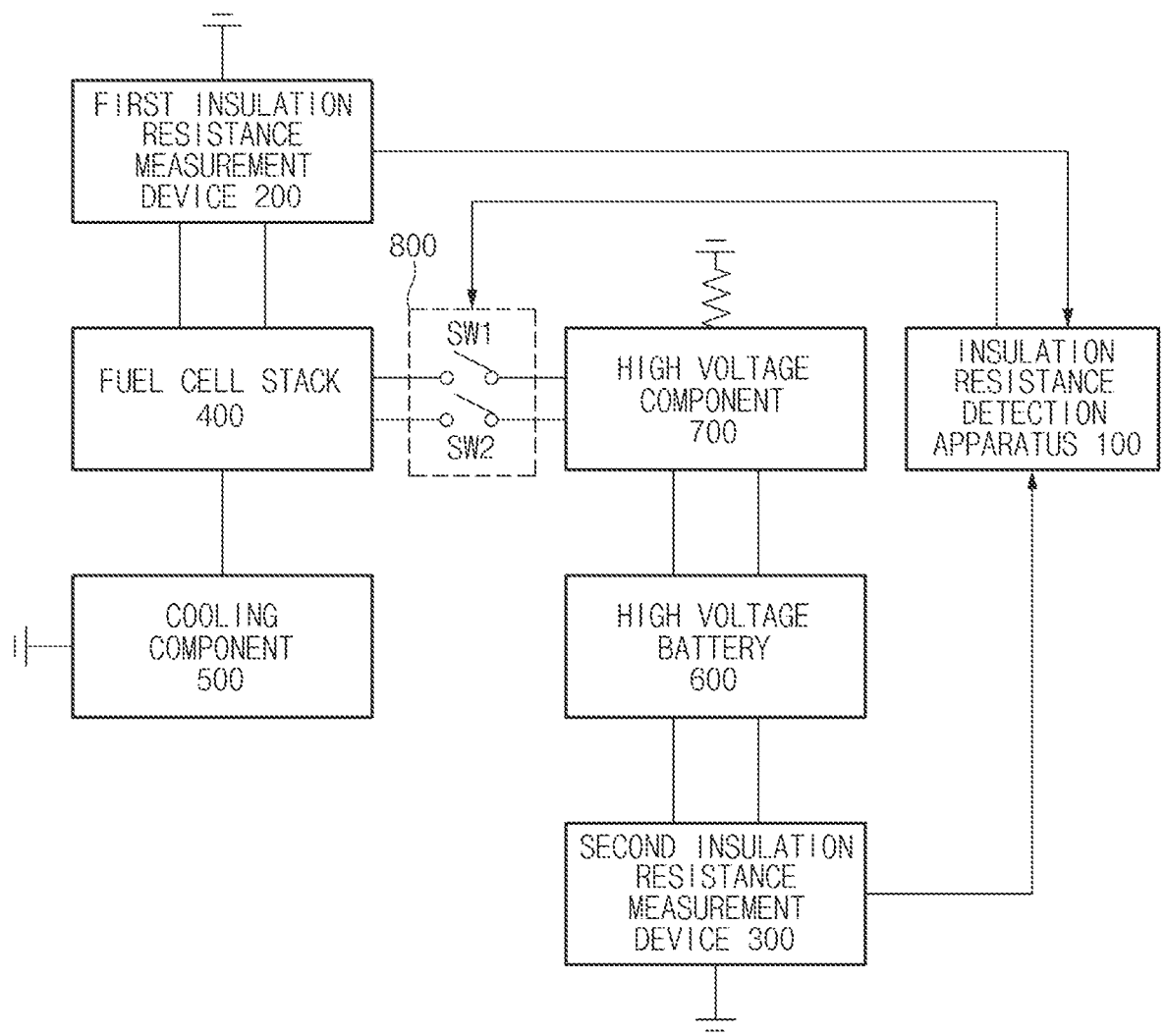
FIG. 1 illustrates a block diagram showing a configuration of a vehicle system including an insulation resistance detection apparatus according to an exemplary embodiment of the present disclosure.

Hereinafter, some exemplary embodiments of the present disclosure will be described in detail with reference to exemplary drawings. It should be noted that in adding reference numerals to constituent elements of each drawing, the same constituent elements have the same reference numerals as possible even though they are indicated on different drawings. In addition, in describing exemplary embodiments of the present disclosure, when it is determined that detailed descriptions of related well-known configurations or functions interfere with understanding of the exemplary embodiments of the present disclosure, the detailed descriptions thereof will be omitted.

In describing constituent elements according to an exemplary embodiment of the present disclosure, terms such as first, second, A, B, (a), and (b) may be used. These terms are only for distinguishing the constituent elements from other constituent elements, and the nature, sequences, or orders of the constituent elements are not limited by the terms. In addition, all terms used herein including technical scientific terms have the same meanings as those which are generally understood by those skilled in the technical field to which the present disclosure pertains (those skilled in the art) unless they are differently defined. Terms defined in a generally used dictionary shall be construed to have meanings matching those in the context of a related art, and shall not be construed to have idealized or excessively formal meanings unless they are clearly defined in the present specification.

Hereinafter, exemplary embodiments of the present disclosure will be described in detail with reference to FIG. 1 to FIG. 6.

FIG. 1 illustrates a block diagram showing a configuration of a vehicle system including an insulation resistance detection apparatus according to an exemplary embodiment of the present disclosure.

Referring to FIG. 1, the vehicle system according to the present exemplary embodiment may include an insulation resistance detection apparatus 100, a first insulation resistance measurement device 200, a second insulation resistance measurement device 300, a fuel cell stack 400, and a cooling component 500, a high voltage battery 600, a high voltage component 700, and a main relay 800.

The insulation resistance detection apparatus 100 according to the exemplary embodiment of the present disclosure may be implemented inside a vehicle. In this case, the insulation resistance detection apparatus 100 may be integrally formed with internal control units of the vehicle, or may be implemented as a separate device to be connected to control units of the vehicle by a separate connection means.

When insulation resistance is lowered during driving of the vehicle, the insulation resistance detection apparatus 100 may separate the fuel cell stack and the high voltage component to measure the insulation resistance value, and may accurately determine a failure cause, checking whether it is a failure due to ionic conductivity, water inflow, incorrect injection of coolant, stack insulation breakdown, or the like by using a variation of the lowered insulation resistance.

The first insulation resistance measurement device 200 may be connected to the fuel cell stack 400 to measure insulation resistance of the fuel cell stack 400, and may correspond to a stack voltage monitoring (SVM).

The second insulation resistance measurement device 300 may be connected to the high voltage battery 600 to measure insulation resistance of the high voltage battery, and may correspond to a battery management system (BMS).

The fuel cell stack 400 may supply power to the vehicle.

The cooling component 500 may be connected to the fuel cell stack 400, and may include a radiator.

The high voltage battery 600 may supply power to the vehicle, and may charge and discharge a voltage.

The high voltage component 700 may be connected between the high voltage battery and the main relay 800, and may include a converter, a motor, and the like.

The main relay 800 may include two switching elements SW1 and SW2 of a parallel structure connected between the fuel cell stack 400 and the high voltage component 700, and controlled by the insulation resistance detection apparatus 100.

Figure 2:
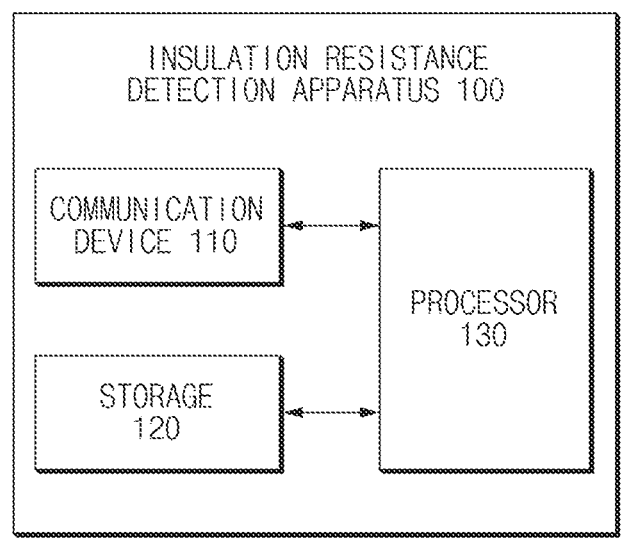
FIG. 2 illustrates a block diagram showing a configuration of an insulation resistance detection apparatus according to an exemplary embodiment of the present disclosure.

FIG. 2 illustrates a block diagram showing a configuration of an insulation resistance detection apparatus according to an exemplary embodiment of the present disclosure.

Referring to FIG. 2, the insulation resistance detection apparatus may include a communication device 110, a storage 120, and a processor 130.

The communication device 110 may be a hardware device implemented with various electronic circuits for in-vehicle network communication. As an example, the in-vehicle network communication techniques may include controller area network (CAN) communication, local interconnect network (LIN) communication, flex-ray communication, and the like.

As an example, the communication device 110 may receive insulation resistance measurement values from the SVM insulation resistance measurement controller 200 and the BMS insulation resistance measurement controller 300.

The storage 120 may store data and/or algorithms required for the processor 130 to operate, and the like. For example, the storage 120 may store an average value of insulation resistance when it is starting off. In addition, the storage 120 may store a reference value for determining a decrease in insulation resistance and a variation reference value for determining an insulation resistance variation. In this case, the reference value and the variation reference value may be predetermined by the experimental value and stored.

The storage 120 may include a storage medium of at least one type among memories of types such as a flash memory, a hard disk, a micro, a card (e.g., a secure digital (SD) card or an extreme digital (XD) card), a random access memory (RAM), a static RAM (SRAM), a read-only memory (ROM), a programmable ROM (PROM), an electrically erasable PROM (EEPROM), a magnetic memory (MRAM), a magnetic disk, and an optical disk.

The processor 130 may be electrically connected to the communication device 110, the storage 120, and the like, may electrically control each component, and may be an electrical circuit that executes software commands, thereby performing various data processing and calculations described below.

The processor 130 may process signals transferred between constituent elements of the insulation resistance detection apparatus 100. The processor 130 may be, e.g., a fuel cell control unit (FCU), an electronic control unit (ECU), a micro controller unit (MCU), or another upper or lower controller, mounted in a vehicle.

When the vehicle is turned off, the processor 130 may calculate an average value of insulation resistance values of the vehicle, and may store the average insulation resistance value in the storage 120. In this case, the processor 130 may calculate the average value of the insulation resistance values of the vehicle measured for each predetermined period from vehicle starting to vehicle starting off. In this case, the insulation resistance values of the vehicle may be insulation resistance values of fuel cells or insulation resistance values of high voltage batteries.

In the case where the insulation resistance value of the vehicle is smaller than a predetermined reference value while driving, the processor 130 may separate the fuel cell and the high voltage battery and may measure the insulation resistance value of the fuel cell to determine whether it is a failure of the high voltage battery, and when it is not the failure of the high voltage battery, may determine whether the failure is due to ionic conductivity by calculating the insulation resistance variation.

In this case, when the insulation resistance of the vehicle is smaller than a predetermined reference value, the processor 130 turns off the main relay 800 connected between the fuel cell and the high voltage battery to separate the fuel cell and the high voltage battery while maintaining an open circuit voltage (OCV) state by blocking a stack current of the fuel cell.

The processor 130 may control the first insulation resistance measurement device 200 to measure the insulation resistance value of the fuel cell in a state where the main relay 800 is turned off, to determine whether the insulation resistance value of the fuel cell is smaller than a predetermined reference value. In this case, the reference value may be predetermined as an experimental value.

In the case where the insulation resistance value of the fuel cell is equal to or greater than a predetermined reference value, the processor 130 may determine that it is a failure due to the insulation resistance of the high voltage battery, and when the insulation resistance value of the fuel cell is smaller than a predetermined reference value, may determine whether it is a failure due to ionic conductivity or a failure due to insulation breakdown of the fuel cell by using the insulation resistance variation. In this case, the processor 130 may calculate a difference value between the average insulation resistance value and the insulation resistance value of the fuel cell as the insulation resistance variation.

The processor 130 may compare the insulation resistance variation and a predetermined variation reference value, and may determine that it is a failure of insulation resistance due to an increase in ionic conductivity when the insulation resistance variation is smaller than the predetermined variation reference value and may determine that it is a failure due to insulation breakdown of the fuel cell when the insulation resistance variation is equal to or greater than a predetermined variation reference value. In this case, the variation reference value may be predetermined as an experimental value.

That is, the processor 130 may determine that it is a failure due to insulation breakdown of the fuel cell when the insulation resistance value rapidly changes, and may determine that it is a failure of insulation resistance due to an increase in ionic conductivity when the insulation resistance value smoothly changes. A detailed description will be given later with reference to FIG. 4 and FIG. 5 with respect to the determination depending on the sudden change and the smooth change of the insulation resistance value.

As such, when it is determined that a failure of insulation resistance due to an increase in ionic conductivity, the processor 130 may notify a user that an ion filter needs to be replaced, and may perform text notification through a display device in the vehicle or voice notification through a speaker.

As such, the processor 130 detects the insulation resistance of the fuel cell stack in an electrical disconnected state in a relay-off state after cutting off a stack current while driving of a vehicle, when the detected insulation resistance value of the fuel cell stack is equal or to greater than a reference value, determines that the fuel cell stack normally operates and that the insulation resistance of the high voltage component is faulty, and when the detected insulation resistance value of the fuel cell stack is smaller than the reference value, determines whether it is a failure due to insulation resistance of the fuel cell stack or a failure due to ionic conductivity by using an amount of change in the fuel cell, to perform failure notification when the ion filter needs to be replaced.

Figure 3:
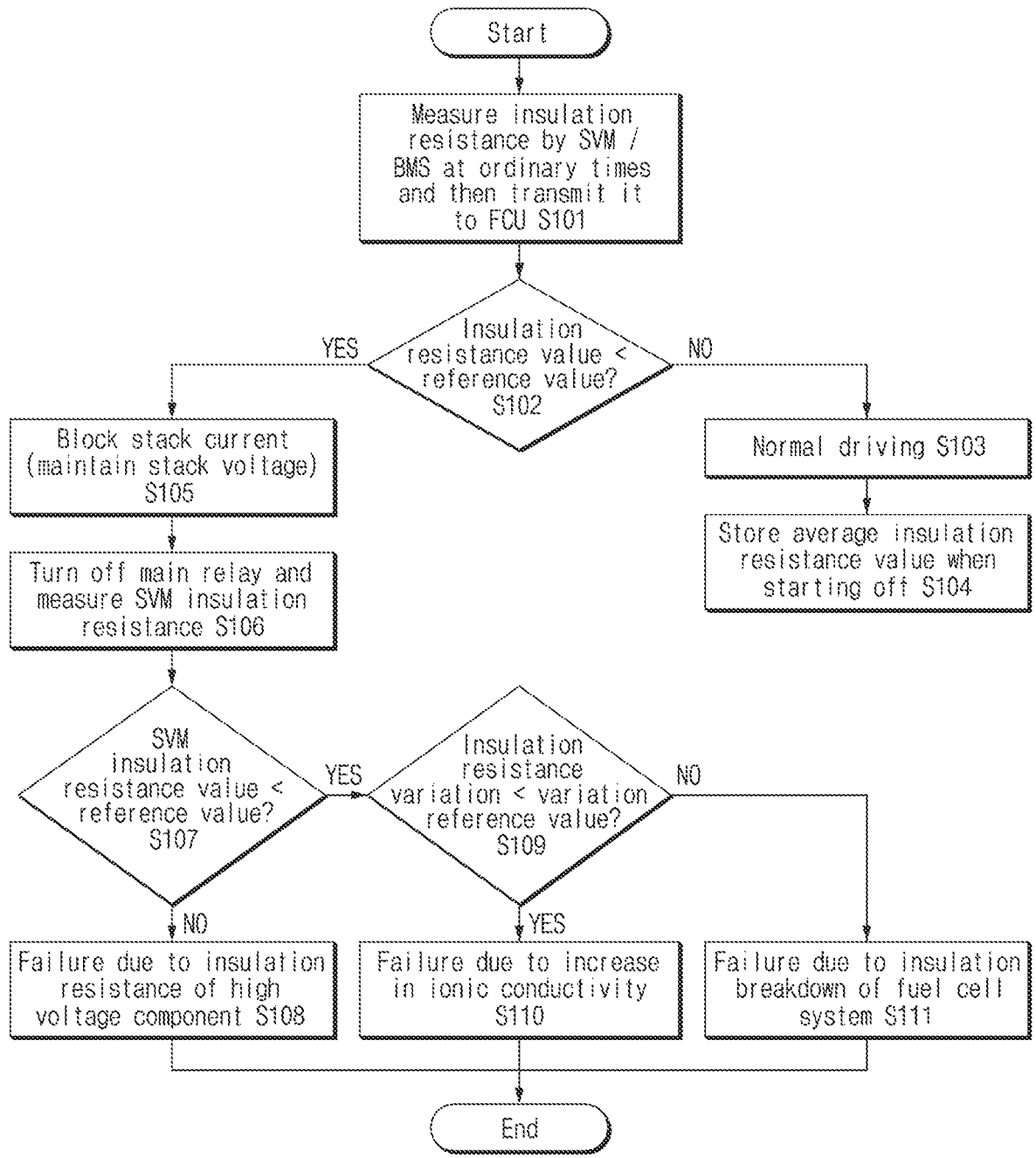
FIG. 3 illustrates an insulation resistance detection method according to an exemplary embodiment of the present disclosure.

Hereinafter, the insulation resistance detection method according to an exemplary embodiment of the present disclosure will be described in detail with reference to FIG. 3 to FIG. 5. FIG. 3 illustrates an insulation resistance detection method according to an exemplary embodiment of the present disclosure.

Hereinafter, it is assumed that the insulation resistance detection apparatus 100 of the of FIG. 1 performs processes of FIG. 3. In addition, in the description of FIG. 3, operations described as being performed by a device may be understood as being controlled by the processor 130 of the insulation resistance detection apparatus 100.

Referring to FIG. 3, the insulation resistance detection apparatus (FCU) 100 receives insulation resistance values measured by the first insulation resistance measurement device (SVM) 200 and the second insulation resistance measurement device (BMS) 300 of the fuel cell through CAN communication at S101.

The insulation resistance detection apparatus 100 compares the received insulation resistance values with a predetermined reference value at S102, determines that it is in a normal driving state when the insulation resistance value is equal to or greater than a predetermined reference value at S103, and calculates and stores an average insulation resistance value when starting is turned off at S104. In this case, the threshold value may be predetermined as an experimental value.

On the other hand, when the insulation resistance value is smaller than a predetermined reference value, the insulation resistance detection apparatus 100 determines that it is in an abnormal driving state and blocks a stack current to maintain a state (open circuit voltage (OCV)) that minimizes the stack current at S105.

Subsequently, the insulation resistance detection apparatus 100 turns off the main relay 800 to separate the fuel cell stack 400 and the high voltage component 700, and then measures an insulation resistance in the first insulation resistance measurement device 200 of an SVM stage at S106.

Then, the insulation resistance detection apparatus 100 may compare an insulation resistance value measured by the first insulation resistance measurement device 200 with a predetermined reference value at S107, and when the insulation resistance value measured by the first insulation resistance measurement device 200 is equal to or greater than the predetermined reference value, may determine that it is not a failure due to insulation resistance of the fuel cell stack 400 but a failure due to insulation resistance of the high voltage component at S108.

On the other hand, when the insulation resistance value measured by the first insulation resistance measurement device 200 is smaller than a predetermined reference value, the insulation resistance detection apparatus 100 compares the insulation resistance variation with a variation reference value at S109.

In this case, the insulation resistance variation, which is an insulation resistance reduction amount, indicates a difference between an average value of the insulation resistance stored in the vehicle during normal driving of the vehicle and a current insulation resistance value. In addition, the insulation resistance variation may be predetermined as an experimental value, and a decrease in insulation resistance due to ionic conductivity is smoothly reduced, whereas a decrease in insulation resistance due to failure of a high voltage component may be determined based on a characteristic that performs rapid reduction.

The insulation resistance detection apparatus 100 may determine that it is a failure of insulation resistance due to an increase in ionic conductivity when the insulation resistance variation is smaller than the variable reference value at S110, and may determine that it is a failure of the fuel cell stack when the insulation resistance variation is equal to or greater than the variable reference value at S111.

That is, in the case of a failure due to insulation resistance of the high voltage component, a sudden decrease in insulation resistance occurs, but it is possible to determine whether the cause of the failure is the ionic conductivity or the fuel cell stack due to the fact that the sudden decrease in insulation resistance does not occur in the event of the failure due to ionic conductivity.

Figure 4:
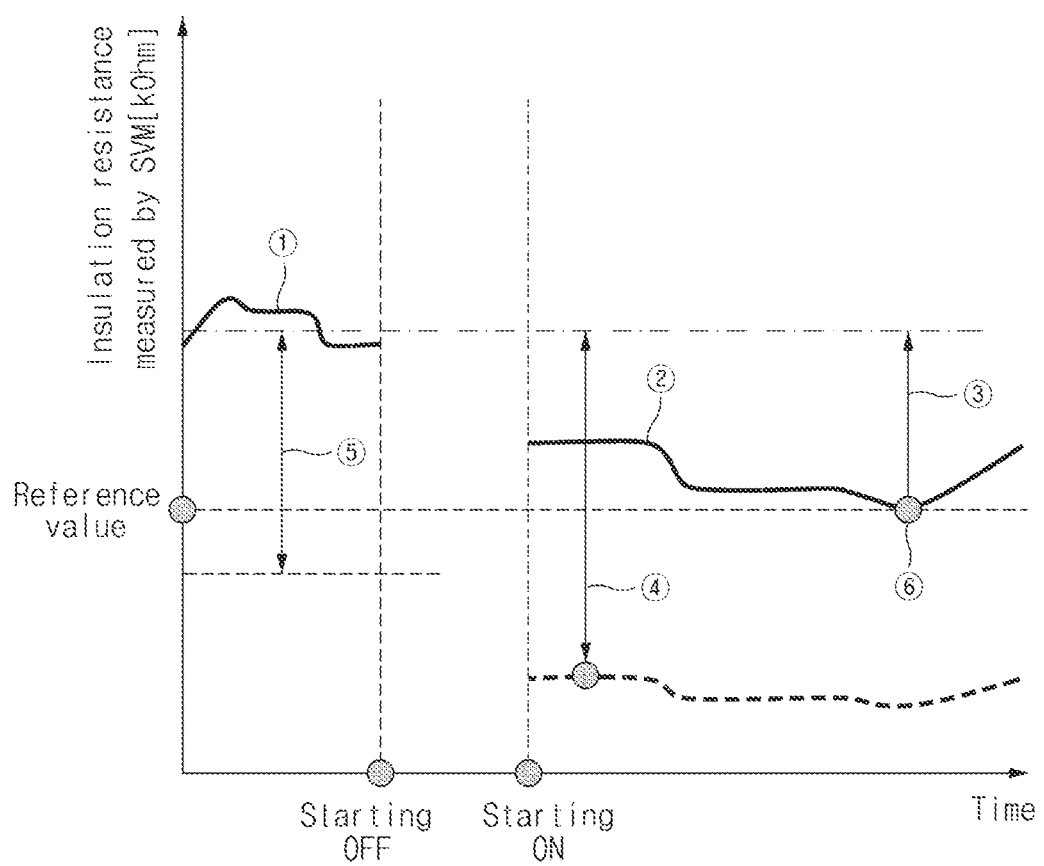
FIG. 4 illustrates a graph for describing a variation of insulation resistance according to an exemplary embodiment of the present disclosure.

FIG. 4 illustrates a graph for describing a variation of insulation resistance according to an exemplary embodiment of the present disclosure. Referring to FIG. 4, an average insulation resistance value during driving in a normal state is equal to a section ①, and is stored when starting off. Thereafter, the starting is on again and an insulation resistance value decreases as shown in a section ② when driving. When the insulation resistance value decreases and reaches a reference value ⑥ and falls below the reference value, the insulation resistance detection apparatus 100 calculates a variation ③ of the insulation resistance value, and compares the variation ③ of the insulation resistance value with a predetermined variation reference value ⑤.

Subsequently, the insulation resistance detection apparatus 100 may determine that it is a failure of insulation resistance due to an increase in ionic conductivity when the variation ③ of the insulation resistance value is smaller than the predetermined variation reference value ⑤, and may determine that it is a failure of insulation resistance due to another reason of the fuel cell stack rather than the increase in ionic conductivity when the insulation resistance value is significantly reduced and a variation ④ of the insulation resistance is greater than the predetermined variation reference value ⑤.

A rate of decrease in insulation resistance per vehicle driving time or per mileage caused by the decrease in insulation resistance due to the increase in ionic conductivity, i.e., a decrease in ion filter performance is about 1,000~10,000 times smaller than a rate of decrease in insulation resistance due to carelessness such as a failure of a high voltage component, mixing of coolants, and incorrect injection.

Figure 5:
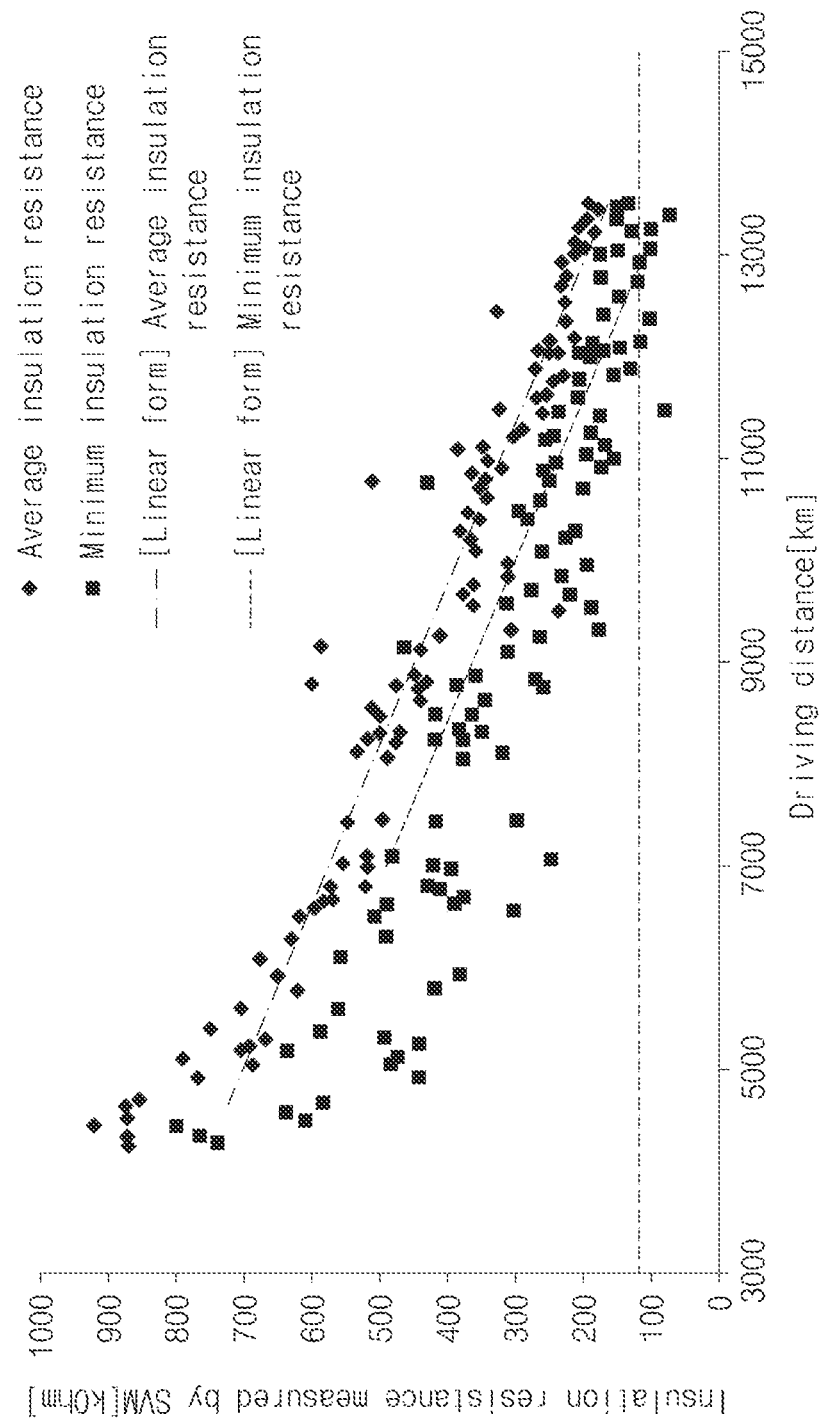
FIG. 5 illustrates a test result of deterioration of ion filter performance according to an exemplary embodiment of the present disclosure.

FIG. 5 illustrates a test result of deterioration of ion filter performance according to an exemplary embodiment of the present disclosure. Referring to FIG. 5, it can be seen that when the ion filter performance decreases, the insulation resistance value linearly decreases to a level of 0.06 kΩ/km, and there is no sudden decrease in insulation resistance. In this case, when the insulation resistance is extremely low (e.g., 10 kΩ or less), it can be determined as a dangerous state such as a failure of a high voltage component or antifreeze contamination.

As such, according to the present disclosure, the decrease in insulation resistance due to a decrease in lifespan of an ion filter may be detected separately from system failure, and when insulation resistance breakdown irrelevant to an increase in ionic conductivity is detected, it may cause system instability, so it is possible to actively carry out countermeasures against failures (e.g., stop of stack power generation, etc.).

In addition, according to the present disclosure, it is possible to prevent unnecessary maintenance and cost and time consumption of a mechanic by separating the fuel cell stack from the high voltage battery and diagnosing insulation resistance failure.

Figure 6:
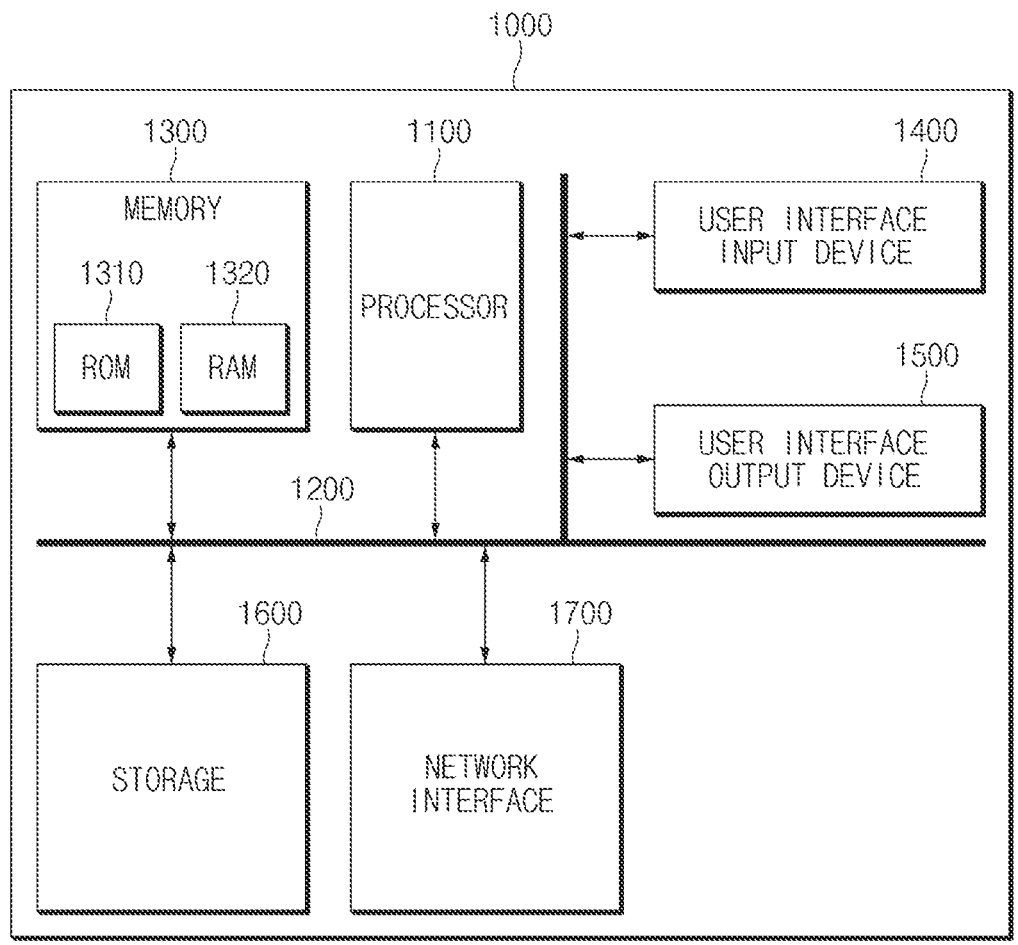
FIG. 6 illustrates a computing system according to an exemplary embodiment of the present disclosure.

FIG. 6 illustrates a computing system according to an exemplary embodiment of the present disclosure.

Referring to FIG. 6, the computing system 1000 includes at least one processor 1100 connected through a bus 1200, a memory 1300, a user interface input device 1400, a user interface output device 1500, and a storage 1600, and a network interface 1700.

The processor 1100 may be a central processing unit (CPU) or a semiconductor device that performs processing on commands stored in the memory 1300 and/or the storage 1600. The memory 1300 and the storage 1600 may include various types of volatile or nonvolatile storage media. For example, the memory 1300 may include a read only memory (ROM) 1310 and a random access memory (RAM) 1320.

Accordingly, steps of a method or algorithm described in connection with the exemplary embodiments disclosed herein may be directly implemented by hardware, a software module, or a combination of the two, executed by the processor 1100. The software module may reside in a storage medium (i.e., the memory 1300 and/or the storage 1600) such as a RAM memory, a flash memory, a ROM memory, an EPROM memory, a EEPROM memory, a register, a hard disk, a removable disk, and a CD-ROM.

An exemplary storage medium is coupled to the processor 1100, which can read information from and write information to the storage medium. Alternatively, the storage medium may be integrated with the processor 1100. The processor and the storage medium may reside within an application specific integrated circuit (ASIC). The ASIC may reside within a user terminal. Alternatively, the processor and the storage medium may reside as separate components within the user terminal.

The above description is merely illustrative of the technical idea of the present disclosure, and those skilled in the art to which the present disclosure pertains may make various modifications and variations without departing from the essential characteristics of the present disclosure.

Therefore, the exemplary embodiments disclosed in the present disclosure are not intended to limit the technical ideas of the present disclosure, but to explain them, and the scope of the technical ideas of the present disclosure is not limited by these exemplary embodiments. The protection range of the present disclosure should be interpreted by the claims below, and all technical ideas within the equivalent range should be interpreted as being included in the scope of the present disclosure.

The invention claimed is:

1. An insulation resistance detection apparatus comprising:
a processor configured to separate a fuel cell from a high voltage battery, by a main relay circuit, based on an insulation resistance value of a vehicle during driving of the vehicle, and to measure an insulation resistance value of the fuel cell with the fuel cell and high-voltage battery separated, by using an insulation resistance measurement device, to determine whether a failure of the fuel cell is present or a failure of the high voltage battery is present, and when the failure of the fuel cell is present, to determine a cause of the failure by calculating a variation of insulation resistance; and
a storage configured to store data and algorithms driven by the processor;
wherein the processor maintains an open circuit voltage (OCV) state by blocking a stack current of the fuel cell when the insulation resistance value of the vehicle is smaller than a predetermined reference value.

2. The insulation resistance detection apparatus of claim 1, wherein the processor calculates an average value of insulation resistance values of the vehicle and stores the average insulation resistance value in the storage during starting off of the vehicle.

3. The insulation resistance detection apparatus of claim 2, wherein the processor turns off a main relay connected between the fuel cell and the high voltage battery when the insulation resistance value of the vehicle is smaller than a predetermined reference value.

4. The insulation resistance detection apparatus of claim 3, wherein the processor compares the insulation resistance value of the fuel cell with a predetermined reference value in a state in which the main relay is turned off.

5. The insulation resistance detection apparatus of claim 4, wherein the processor determines that the failure due to insulation resistance of the high voltage battery exists when the insulation resistance value of the fuel cell is equal to or greater than the reference value.

6. The insulation resistance detection apparatus of claim 4, wherein the processor, when the insulation resistance value of the fuel cell is smaller than the predetermined reference value,
calculates a difference value between the average insulation resistance value and the insulation resistance value of the fuel cell as the variation of insulation resistance.

7. The insulation resistance detection apparatus of claim 6, wherein the processor compares the variation of insulation resistance and a predetermined variation reference value to determine that the a failure of insulation resistance due to an increase in ionic conductivity exists when the insulation resistance variation is smaller than the variation reference value, and to determine that the failure due to insulation breakdown of the fuel cell exists when the insulation resistance variation is equal to or greater than the variation reference value.

8. The insulation resistance detection apparatus of claim 7, wherein the processor notifies replacement of an ion filter when it is determined that the failure of insulation resistance is due to the increase in ionic conductivity.

9. The insulation resistance detection apparatus of claim 6, wherein the processor determines that the failure due to insulation breakdown of the fuel cell exists when the insulation resistance value rapidly changes, and determines that the failure of insulation resistance due to an increase in ionic conductivity exists when the insulation resistance value smoothly changes.

10. A vehicle system comprising:
a fuel cell configured to supply power;
a high voltage battery configured to charge and discharge;
a main delay positioned between the fuel cell and the high voltage battery;
a first insulation resistance measurement device connected to an output terminal of the fuel cell to measure an insulation resistance value of the fuel cell;
a second insulation resistance measurement device connected to an output terminal of the high voltage battery to measure an insulation resistance value of the high voltage battery; and
an insulation resistance detection apparatus configured to separate a fuel cell from a high voltage battery based on an insulation resistance value of a vehicle during driving of the vehicle, and to determine whether a failure of the fuel cell is present or a failure of the high voltage battery is present, and when the failure of the fuel cell is present using the insulation resistance value measured when the fuel cell and high voltage battery are separated, to determine a cause of the failure by calculating a variation of insulation resistance;
wherein the insulation resistance detection apparatus turns off a main relay connected between the fuel cell and the high voltage battery when the insulation resistance value of the vehicle is smaller than a predetermined reference value, and controls the first insulation resistance measurement device to measure the insulation resistance value of the fuel cell.

11. The vehicle system of claim 10, wherein the insulation resistance detection apparatus determines that the failure due to insulation resistance of the high voltage battery is present when the insulation resistance value of the fuel cell is equal to or greater than the reference value, and calculates the variation of insulation resistance when the insulation resistance value of the fuel cell is smaller than the reference value.

12. The vehicle system of claim 11, wherein the insulation resistance detection apparatus calculate an average value of insulation resistance values of the vehicle and store the average insulation resistance value in the storage when starting off the vehicle, and calculates a difference value between the average insulation resistance value and the insulation resistance value of the fuel cell as the variation of insulation resistance.

13. An insulation resistance detection method comprising:
separating, by a main relay circuit, a fuel cell from a high voltage battery based on an insulation resistance value of a vehicle during driving of the vehicle;
determining, by using an insulation resistance measurement device, whether a failure of the fuel cell is present or a failure of the high voltage battery is present by measuring the insulation resistance value of the fuel cell with the fuel cell and high-voltage battery separated; and
determining, by the insulation resistance measurement device, a cause of the failure by calculating a variation of insulation resistance when the failure of the fuel cell is present;
wherein the separating of the fuel cell and the high voltage battery includes:
maintaining an open circuit voltage (OCV) state by blocking a stack current of the fuel cell when the insulation resistance value of the vehicle is smaller than a predetermined reference value; and
turning off a main relay connected between the fuel cell and the high voltage battery.

14. The insulation resistance detection method of claim 13, further comprising calculating an average value of insulation resistance values of the vehicle and store the average insulation resistance value in the storage when starting off the vehicle.

15. The insulation resistance detection method of claim 13, wherein the determining of whether the failure of the fuel cell is present or the failure of the high voltage battery is present includes:
determining whether the insulation resistance value of the fuel cell is smaller than the reference value in a state where the main relay is turned off; and determining that the a failure due to insulation resistance of the high voltage battery is present when the insulation resistance value of the fuel cell is equal to or greater than the reference value.

16. The insulation resistance detection method of claim 15, wherein the determining of the cause of the failure includes, when the insulation resistance value of the fuel cell is smaller than the reference value, calculating a difference value between the average insulation resistance value and the insulation resistance value of the fuel cell as the variation of insulation resistance.

17. The insulation resistance detection method of claim 16, wherein the determining of the cause of the failure further includes:
   comparing the variation of insulation resistance and a predetermined variation reference value;
   determining that the a failure of insulation resistance due to an increase in ionic conductivity is present when the insulation resistance variation is smaller than the variation reference value; and
   determining that the failure due to insulation breakdown of the fuel cell is present when the insulation resistance variation is equal to or greater than the variation reference value.

* * * * *